United States Patent
Yeh et al.

(10) Patent No.: US 7,989,048 B2
(45) Date of Patent: Aug. 2, 2011

(54) FLEXIBLE BASE FOR MANUFACTURING FLEXIBLE PRINTED CIRCUIT BOARDS

(75) Inventors: Tso-Hung Yeh, Taoyuan (TW);
Chia-Cheng Chen, Taoyuan (TW);
Pei-Yu Chao, Taoyuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 822 days.

(21) Appl. No.: 11/960,659

(22) Filed: Dec. 19, 2007

(65) Prior Publication Data
US 2009/0011186 A1 Jan. 8, 2009

(30) Foreign Application Priority Data
Jul. 4, 2007 (CN) .......................... 2007 1 0076393

(51) Int. Cl.
*B32B 3/24* (2006.01)
*H01L 23/48* (2006.01)
(52) U.S. Cl. ........ 428/137; 428/209; 428/901; 257/666; 257/668; 257/670

(58) Field of Classification Search ................ 428/137, 428/901, 209; 257/666, 668, 670
See application file for complete search history.

(56) References Cited

U.S. PATENT DOCUMENTS
5,237,201 A * 8/1993 Tanaki et al. ............... 257/666
2006/0068164 A1 * 3/2006 Iguchi ........................ 428/131

FOREIGN PATENT DOCUMENTS
TW    200621112 A    6/2006
TW    I262159    9/2006
* cited by examiner

*Primary Examiner* — William P Watkins, III
(74) *Attorney, Agent, or Firm* — Jeffrey T. Knapp (57) ABSTRACT

A flexible base includes a main region configured for forming flexible printed circuit board units; and two conveying regions respectively arranged on two sides of the main region. Each of the conveying regions includes an insulating substrate, a plurality of sprocket holes, and a patterned supporting layer. The sprocket holes are defined along a lengthwise direction of the insulating substrate. The patterned supporting layer is formed on the insulating substrate. The patterned supporting layer extends from an edge of each sprocket hole towards a periphery region of the corresponding sprocket.

20 Claims, 5 Drawing Sheets

ly used in portable electronic devices such as mobile phones, digital cameras and personal digital assists (PDA). -->

FLEXIBLE BASE FOR MANUFACTURING FLEXIBLE PRINTED CIRCUIT BOARDS

BACKGROUND OF THE INVENTION

1. Field of the Invention

The present invention relates to flexible printed circuit boards and, particularly, to a flexible base for making flexible printed circuit boards.

2. Description of Related Art

Flexible printed circuit boards (FPCBs) are widely used in portable electronic devices such as mobile phones, digital cameras and personal digital assists (PDA). In some circumstances, parts within the electronic devices may move relative to the main body. In such situations, FPCB can maintain the electrical connection between the main body and the movable parts due to their excellent flexibility.

Figure 5:
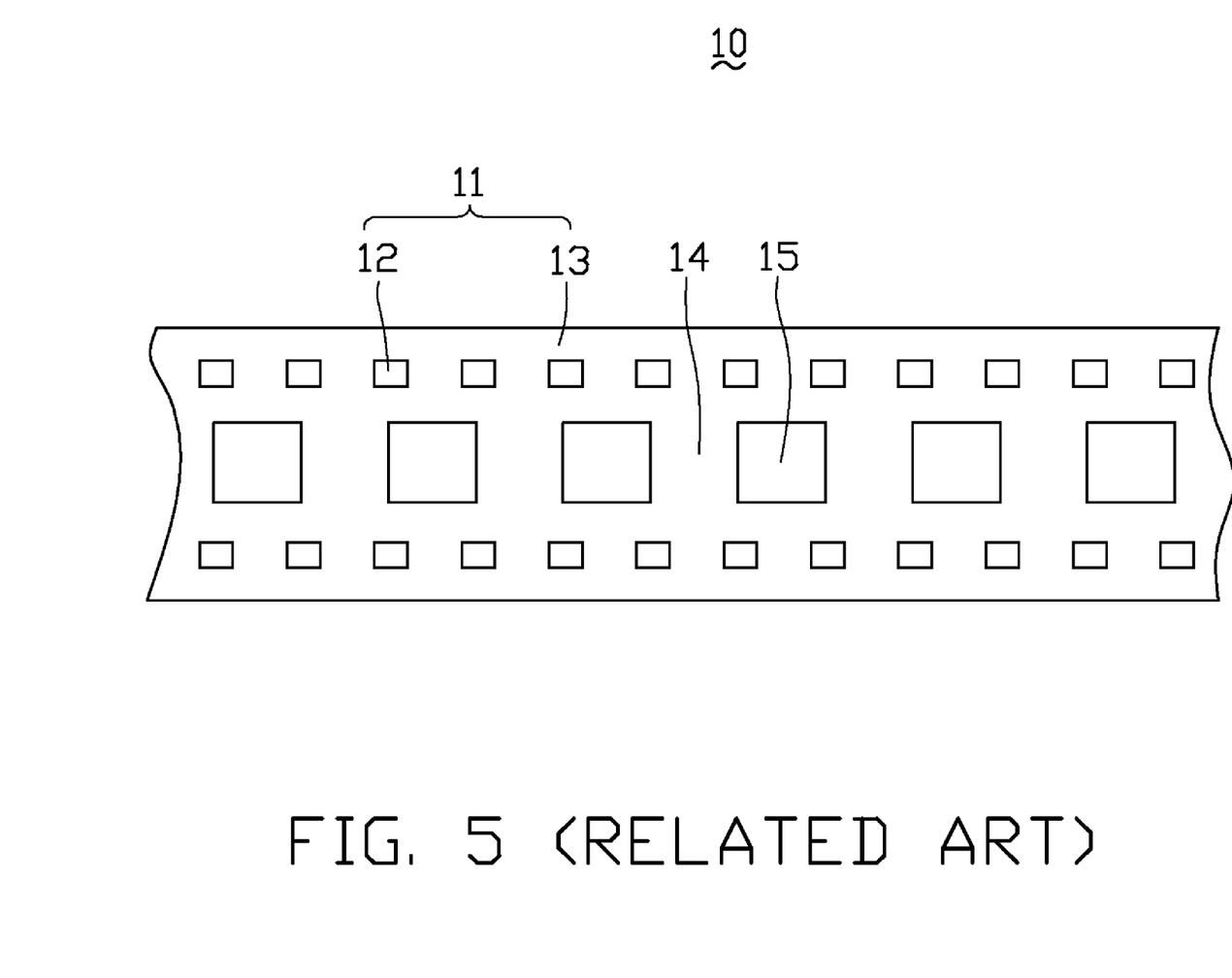
FIG. 5 is a schematic view of a flexible base, in accordance with a prior art.

Nowadays, roll-to-roll process is employed for mass-producing FPCBs. In order to implement roll-to-roll process, a large sheet of raw material is divided into a number of tape-shaped substrates. Sizes of tape-shaped substrates can be predetermined according to the sizes of the desired FPCBs. FIG. 5 shows a typical tape-shaped substrate 10. The tape-shaped substrate 10 includes a main region 14 for forming FPCB units therein and two conveying regions 11. The main region 14 is disposed along a lengthwise direction of the tape-shaped substrate 10. Two conveying regions 11 is separately arranged at two sides of the main region 14. Each conveying region 11 includes a number of sprocket holes 12 and a continuous copper layer 13 surrounding the sprocket holes 12. The sprocket holes 12 are disposed along the lengthwise direction of the conveying region 11.

In a roll-to-roll process, the sprocket holes 12 are used to mate with rollers to convey the tape-shaped substrate 10. The continuous copper layer 13 is provided to support the sprocket holes 12, so as to avoid deformations of the sprocket holes 12 during the conveying process. After the FPCB units have been molded, the conveying region 11 will be thrown away. However, during an electro-plating process gold/nickel will be plated on the continuous copper layer 13. Thus, these valuable materials (e.g., gold/nickel) will be wasted when the conveying region 11 is thrown away.

Therefore, a new flexible base is desired to overcome the above-described shortcomings.

SUMMARY OF THE INVENTION

An embodiment of a flexible base for manufacturing flexible printed circuit boards is provided. The flexible base includes a conveying region. The conveying region includes an insulating substrate, a plurality of sprocket holes, and a plurality of first supporting traces. The sprocket holes are defined along a lengthwise direction of the insulating substrate. A patterned supporting layer is formed on the insulating substrate. The patterned supporting layer includes a plurality of first supporting traces, at least two second supporting traces, a plurality of third supporting traces, and a plurality of fourth supporting traces. Each first supporting trace has an inner profile and an outer profile. The inner profile and an edge of a corresponding sprocket hole are collinear. The at least two supporting traces are respectively configured on two sides of the sprocket holes along the lengthwise direction of the insulating substrate. The third supporting traces are configured for interconnecting adjacent first supporting traces. The fourth supporting traces are configured for connecting the first supporting traces and the second supporting traces.

An embodiment of a flexible base includes a main region configured for forming flexible printed circuit board units and two conveying regions respectively arranged on two sides of the main region. Each of the conveying regions includes an insulating substrate, a plurality of sprocket holes, and a patterned supporting layer. The sprocket holes are defined along a lengthwise direction of the insulating substrate. The patterned supporting layer is formed on the insulating substrate. The patterned supporting layer extends from an edge of each sprocket hole towards a periphery region of the corresponding sprocket.

Advantages and novel features will become more apparent from the following detailed description when taken in conjunction with the accompanying drawings.

BRIEF DESCRIPTION OF THE DRAWINGS

Many aspects of the present flexible base with reference to the following drawings. The components in the drawings are not necessarily drawn to scale, the emphasis instead being placed upon clearly illustrating the principles of the present flexible base. Moreover, in the drawings, like reference numerals designate corresponding parts throughout the several views.

DETAILED DESCRIPTION OF THE INVENTION

Embodiments will now be described in detail below and with reference to the drawings.

Figure 1:
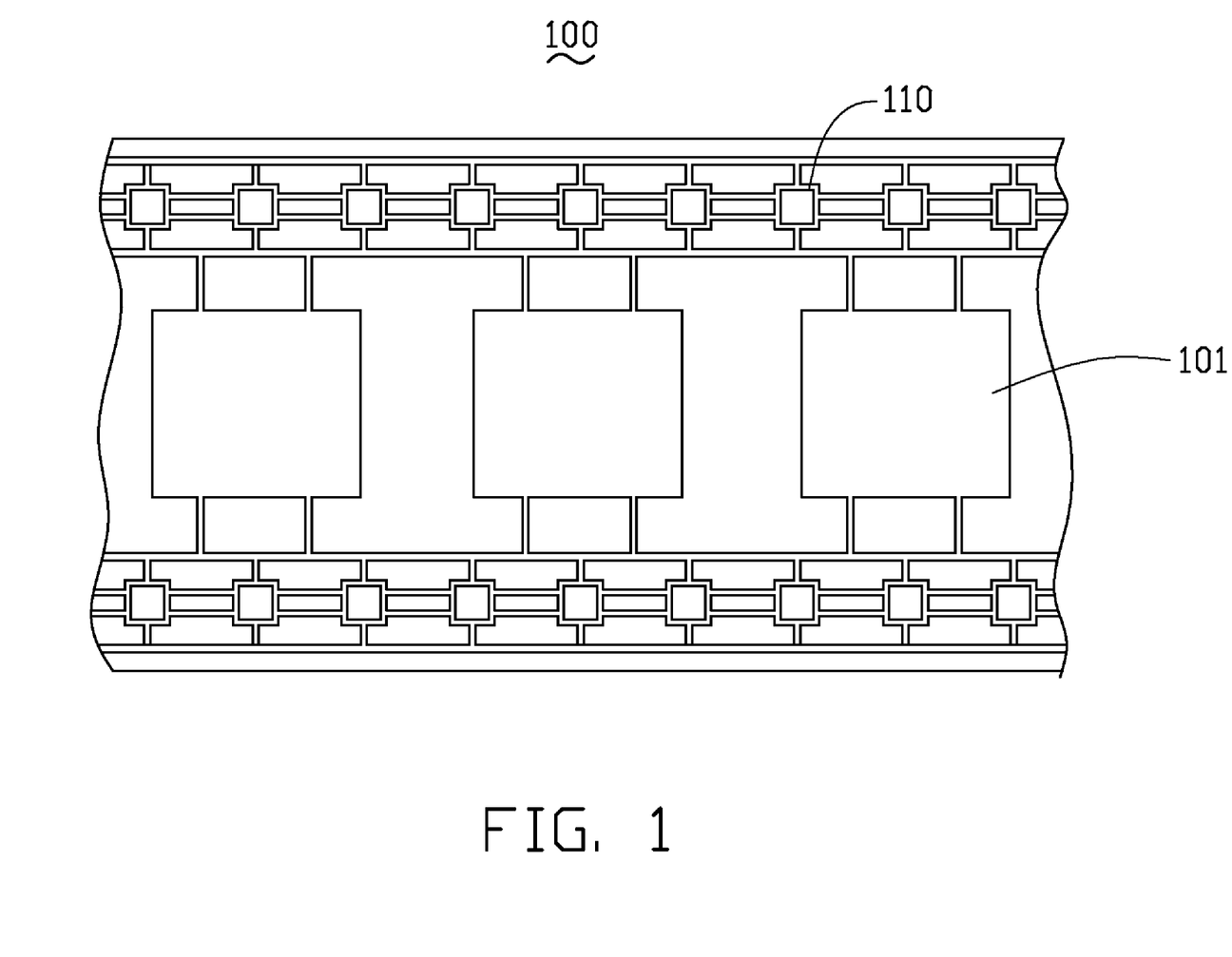
FIG. 1 is a schematic view of a flexible base, in accordance with a present first embodiment.

Referring to FIG. 1, a flexible base 100, in accordance with a first embodiment, is shown. The flexible base 100 is a preform (i.e., a semi-product) for mass-producing flexible printed circuit boards using a roll-to-roll process. The flexible base 100 is a tape-shaped copper-clad laminate. The flexible base 100 includes a number of FPCB unit regions 101 and two conveying regions 110. The FPCB unit regions 101 are defined in a central portion of the flexible base 100 and arranged along a lengthwise direction of the flexible base 100. The two conveying regions 110 are respectively disposed on two sides of the FPCB unit regions 101. That is, the two conveying regions 110 are defined in peripheral portions of the flexible base 100. The conveying regions 110 are configured for conveying the flexible base 100 from one stage to another stage in the roll-to-roll process. The conveying regions 110 each include an insulating substrate and a metal film formed on the insulating substrate. During an electro-plating process, in order to avoid the plating material being formed on the metal film of each conveying region 110, the metal film of the conveying region 110 is patterned by partially covering the insulating substrate. The metal film formed on the insulating substrate of the conveying region 110 can have various patterns. In the following, a specific embodiment of the metal film pattern is described.

Figure 2:
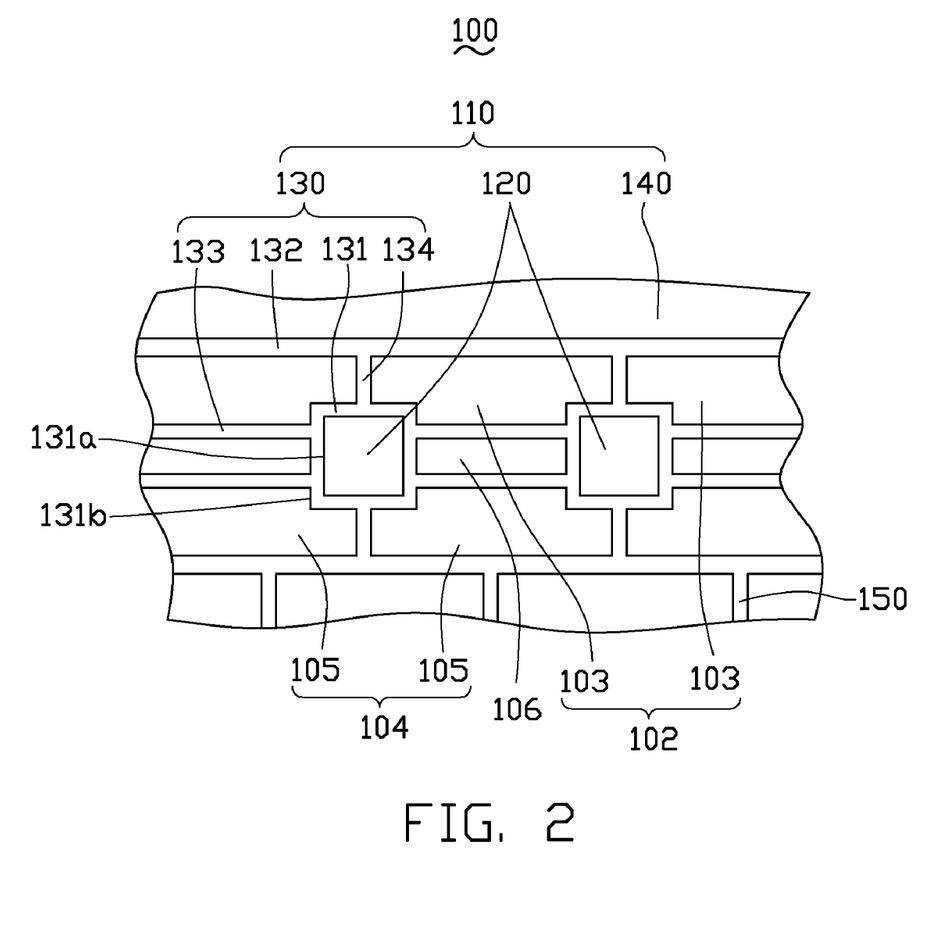
FIG. 2 is a schematic view of a conveying region of the flexible base of FIG. 1.
Figure 3:
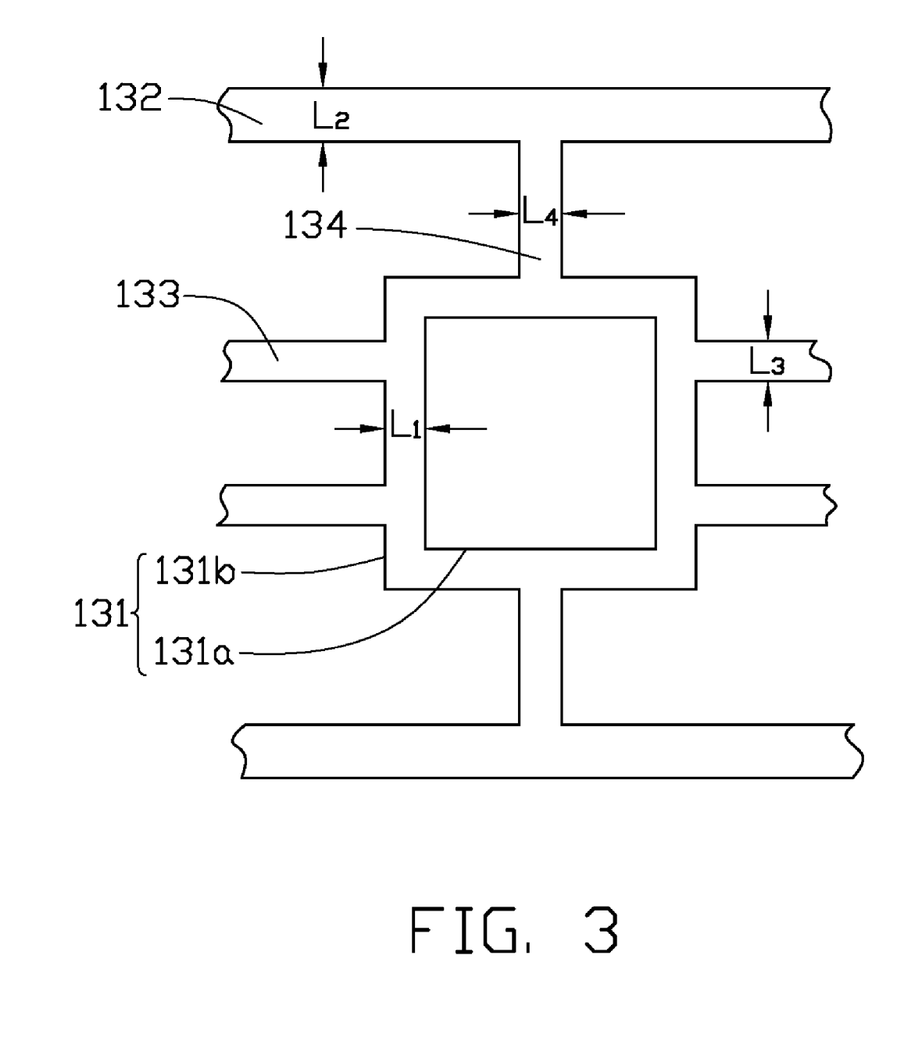
FIG. 3 is an enlarged view of a sprocket hole of the conveying region of FIG. 2.

Referring to FIG. 2 and FIG. 3, the conveying region 110 includes an insulating substrate 140, a patterned supporting layer 130, and a number of sprocket holes 120. The sprocket holes 120 are defined in the insulating substrate 140, and aligned along a lengthwise direction of the insulating substrate 140. More specifically, the sprocket holes 120 are horizontally aligned with each other. The patterned supporting layer 130 is disposed at a periphery of each of the sprocket holes 120. Materials of the patterned supporting layer 130 have a higher rigidity than materials of the insulating substrate 140. For example, the patterned supporting layer 130 can be made of copper, gold, or alloys thereof. Thus, during a conveying process, the patterned supporting layer 130 can maintain a shape of each of the sprocket holes 120. Therefore, the shape of each of the sprocket holes 120 is not deformed.

In the present embodiment, the patterned supporting layer 130 is made of copper. It is to be understood that other rigid materials could potentially be provided and be within the scope of the patterned supporting layer 130.

The patterned supporting layer 130 includes a number of first supporting traces 131, at least two second supporting traces 132, a number of third supporting traces 133, and a number of fourth supporting traces 134. The first supporting trace 131 is a ring configuration extending from an edge of a corresponding sprocket hole 120 towards a periphery region of such sprocket hole 120. Each of the first supporting traces 131 includes an inner profile 131*a* and an outer profile 131*b*. The inner profile 131*a* of the first supporting trace 131 and the edge of the corresponding sprocket hole 120 surrounded by the inner profile 131*a* are collinear. The shape and size of the outer profile 131*b* may be similar or dissimilar to those of the inner profile 131*a*. In this embodiment, the outer profile 131*b* and inner profile 131*a* have a similar shape and share a common center. Thus, each first supporting trace 131 has a uniform width W1 (i.e., a distance between the outer profile 131*b* and inner profile 131*a*). The width W1 is in a range from about 0.2 millimeters to about 0.6 millimeters. In present embodiment, the width W1 is about 0.4 millimeters.

For example, the sprocket hole 120 is rectangular in shape. A length of the rectangular sprocket hole 120 is about 1.43 millimeters, and a width is about 1.42 millimeters. The inner profile 131*a* and the edge of the rectangular sprocket hole 120 are collinear, and the outer profile 131*b* extends from the edge of the rectangular sprocket hole 120 to form a rectangular pattern. Therefore, the rectangular inner profile 131*a* and the rectangular outer profile 131*b* constitute a rectangular ring first supporting trace 131. Because the width W1 of the first supporting trace 131 surrounding the corresponding sprocket hole 120 is uniform, all the edges and sides of the sprocket hole 120 are supported by the first supporting trace 131 with the same degree of strength/force. Therefore, in the conveying process, the shape of each of the sprocket holes 120 is effectively maintained by the first supporting trace 131, and the shapes of the sprocket holes 120 are not deformed. Accordingly, the roll-to-roll process can be performed continuously and stably due to the stable conveying process.

Alternatively, two or more first supporting traces 131 can be provided at the periphery of each of the sprocket holes 120. Shapes and materials of the two or more first supporting traces 131 may be identical or different.

The second supporting traces 132 are configured for reinforcing rigidity for the whole conveying region 110. Each of the second supporting traces 132 extends along the lengthwise direction of the conveying region 110. At least one of the second supporting traces 132 is arranged on one side of the sprockets 120 along a lengthwise direction of the conveying region 110. In the present embodiment, the patterned supporting layer 130 has two second supporting traces 132. The two second supporting traces 132 are respectively arranged on two sides of the sprockets 120. One of the second supporting traces 132 can be electrically connected with working traces 150 according to the requirements of sequential electro-plating processes. That is, the working traces 150 interconnect the FPCB unit regions 101 and one of the second supporting traces 132. For example, in a gold electro-plating process, the second supporting traces 132 implement an electrical connection between the working traces 150 and the gold electrode.

Each of the second supporting traces 132 has a width W2. Each second supporting trace 132 may be a patterned wire with uniform width. The uniform width of each second supporting trace 132 is in a range from about 0.15 millimeters to about 0.3 millimeters. In addition, each of the second supporting traces 132 may be a patterned wire with non-uniform width. In such case, a minimal width of each second supporting trace 132 is in a range from about 0.15 millimeters to about 0.3 millimeters. Suitably, the uniform width or the average width is 0.15 millimeters. In the present embodiment, each second supporting trace 132 is a straight copper wire with uniform width. The uniform width is 0.15 millimeters.

The third supporting traces 133 each are configured for interconnecting with two adjacent first supporting traces 131 so as to reinforce the rigidity of the portions of the conveying region 110 which are between the two adjacent first supporting traces 131. Because of the third supporting traces 133 interconnecting the first supporting traces 131 and being on opposite sides of adjacent sprocket holes 120 each first supporting trace 131 along the lengthwise direction of the conveying region 110, all of the separate first supporting traces 131 are connected together and form an integrated configuration. As such, the conveying region 110 achieves a desired rigidity. In order to accommodate different FPCB processes, the conveying region 110 may have different rigidities. Thus, based on the requirements of the roll-to-roll process, the number, width and shape of the third supporting traces 133 may be different in order to achieve the desired rigidity. An elongated first blank area 102 is defined generally between one second supporting trace 132 and the nearest series of third supporting traces 133, and an elongated second blank area 104 is defined between the other second supporting trace 132 and the nearest series of third supporting traces 133. In the first and the second blank areas 102 and 104, the insulating substrate 140 is exposed to the exterior and is not covered by materials of the patterned supporting layer 130. In the illustrated embodiment, there are two parallel third supporting traces 133 between each two adjacent first supporting traces 131. A plurality of third blank areas 106 are defined between the two parallel third supporting traces 133. Each third blank area 106 is located between two corresponding adjacent first supporting traces 131. In the third blank area 106, the insulating substrate 140 is exposed to the exterior and is not covered by materials of the patterned supporting layer 130.

A width of the third supporting traces 133 is represented as W3. Each of the third supporting traces 133 may be a patterned wire with uniform width. The uniform width of each third supporting trace 133 is in a range from about 0.2 millimeters to about 0.45 millimeters. In addition, each of the third supporting traces 133 may be a patterned wire with non-uniform width. In such case, a minimal width of each third supporting trace 133 is in a range from about 0.2 millimeters to about 0.45 millimeters. Suitably, the uniform width or the average width is 0.2 millimeters. In the present embodiment, each third supporting trace 133 is a straight copper line with uniform width. The uniform width is 0.2 millimeters.

The fourth supporting traces 134 are configured for connecting the first supporting traces 131 and the second supporting traces 132. In the lengthwise direction of the conveying region 110, at least one fourth supporting trace 134 is provided between each first supporting trace 131 surrounding one sprocket hole 120 and a portion of each of the second supporting traces 132 corresponding to the first supporting trace 131. In the illustrated embodiment, there is one fourth supporting trace 134 connecting one side of each first supporting trace 131 with the portion of the nearest second supporting trace 132, and another fourth supporting trace 134 connecting an opposite side of each first supporting trace 131 with the portion of the nearest second supporting trace 132. In such fashion, in a width direction of the conveying region 110, all of the sprocket holes 120 are reinforced by the fourth supporting traces 134. The elongated first blank area 102 is separated by the corresponding fourth supporting traces 134 into a plurality of first blank portions 103, which are arranged in line along the lengthwise direction of the conveying region 110. The elongated second blank area 104 is separated by the corresponding fourth supporting traces 134 into a plurality of second blank portions 105, which are arranged in line along the lengthwise direction of the conveying region 110.

A width of each of the fourth supporting traces 134 is represented as W4. Each of the fourth supporting traces 134 may be a patterned wire with uniform width. The uniform width of each fourth supporting trace 134 is in a range from about 0.2 millimeters to about 0.45 millimeters. In addition, each of the fourth supporting traces 134 may be a patterned wire with non-uniform width. In such environment, a minimal width of each fourth supporting trace 134 is in a range from about 0.2 millimeters to about 0.45 millimeters. Suitably, the uniform width or the average width is 0.2 millimeters. In the present embodiment, each fourth supporting trace 134 is copper beeline wire with uniform width. The uniform width is 0.2 millimeters.

With respect to the above configuration of the conveying region 110, the patterned supporting layer 130 does not fully cover the insulating substrate 140. During an electro-plating process, the flexible base 100 is immersed into an electro-plating solution. When the electro-plating process is performed, the plating material can, inevitably, be formed on the conveying region 110 due to the presence of the patterned supporting layer 130. Because the patterned supporting layer 130 is made of metal materials, the plating material is only formed on the patterned supporting layer 130. However, in the present embodiment, the patterned supporting layer 130 does not fully cover the insulating substrate 140. Therefore, the plating material cannot be formed on the whole surface of the conveying region 110. Thus, compared with the continuous copper layer formed on the conveying region of the conventional flexible bases, the present flexible bases can greatly save the use of plating materials, particularly during electroplating processes.

It is to be understood that the patterned supporting layer 130 may be a pattern (e.g., regular or regular pattern), or a discontinuous film, as long as the patterned supporting layer 130 does not fully cover the insulating substrate 140. In addition, in the patterned supporting layer 130, the number, shape, size of the first, second, third, and fourth supporting traces 131, 132, 133, and 134 can be changed or predetermined according to practical requirement.

Figure 4:
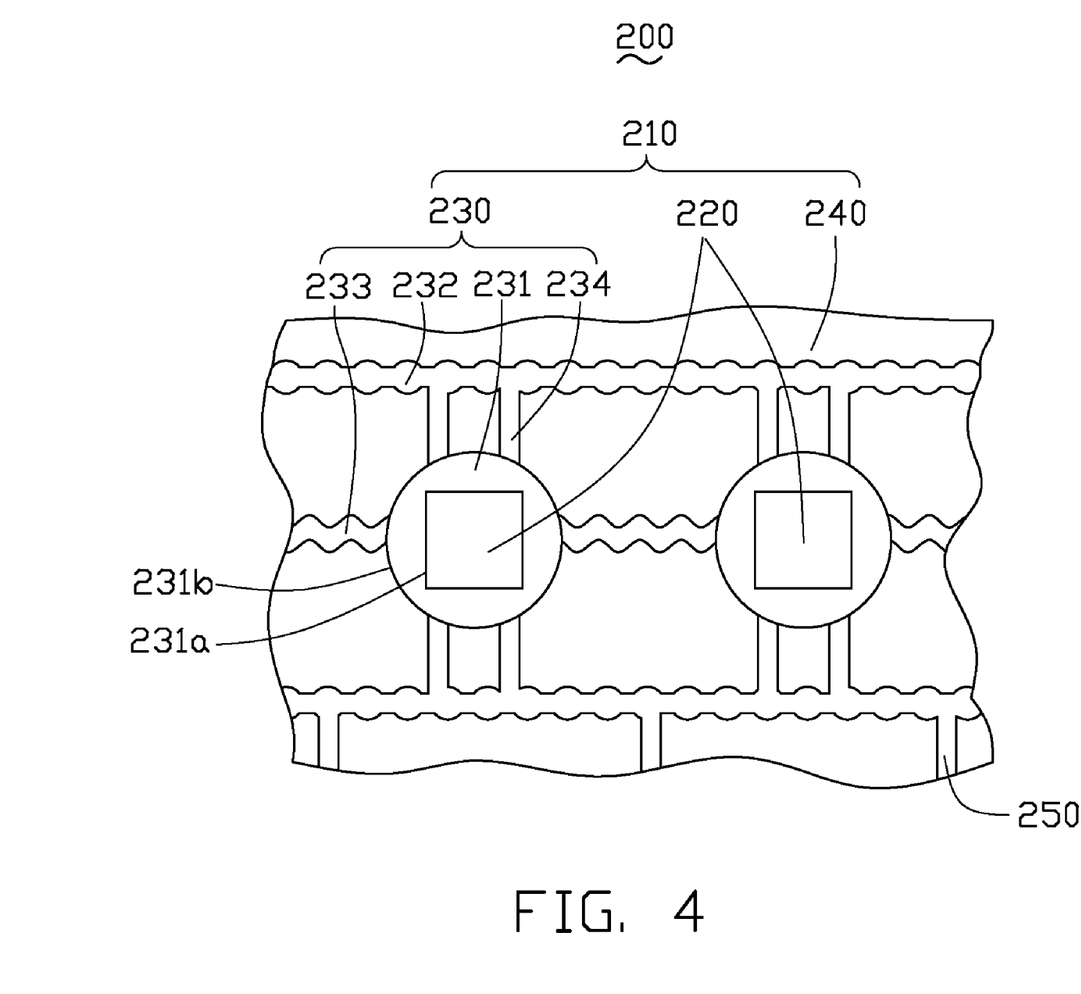
FIG. 4 is a schematic view of a flexible base, in accordance with a present second embodiment.

Referring to FIG. 4, a flexible base 200, in accordance with a second embodiment, is shown. The flexible base 200 is a tape-shaped copper-clad laminate. The flexible base 200 is similar to the flexible base 100 except for a conveying region 210 of the flexible base 200. The conveying region 210 includes a number of sprocket holes 220, a patterned supporting layer 230, and an insulating substrate 240. The sprocket holes 220 are defined in the insulating substrate 240 and are horizontally aligned with each other. The alignment of the sprocket holes 220 is arranged in a center portion along the lengthwise direction of the conveying region 210. The patterned supporting layer 230 is configured for reinforcing each of the sprocket holes 220. The patterned supporting layer 230 includes a number of first supporting traces 231, at least two second supporting traces 232, a number of third supporting traces 233, and a number of fourth supporting traces 234.

Shapes and sizes of the sprocket holes 220 of the present embodiment are identical with those of the sprocket holes 120 of the first embodiment. The first supporting trace 231 has a ring configuration extending from an edge of a corresponding sprocket hole 220. Each first supporting trace 231 includes an inner profile 231a and an outer profile 231b. The inner profile 231a is rectangular, and the outer profile 231b is circular. A minimal width (a minimal distance between the inner profile 231a and the outer profile 231b) of each first supporting trace 231 is in a range from about 0.2 millimeters to 0.6 millimeters.

The second supporting traces 232 of the present embodiment have a similar function to the second supporting traces 132 of the first embodiment. In the present embodiment, each of the second supporting traces 232 can be defined by two generally parallel waved copper lines or two generally parallel zigzag copper lines. A minimal width (a minimal distance between two parallel waved copper lines or two parallel zigzag copper lines) of each second supporting trace 232 is in a range from about 0.2 millimeters to 0.45 millimeters.

The third supporting traces 233 are configured for interconnecting adjacent first supporting traces 231 for sustaining adjacent sprocket holes 220. Each of the third supporting traces 233 is a copper line with non-uniform width. For example, each third supporting trace 233 can be defined by two parallel waved copper lines or two parallel zigzag copper lines. A minimal width (a minimal distance between two parallel waved copper lines or two parallel zigzag copper lines) of each third supporting trace 233 is in a range from about 0.2 millimeters to 0.45 millimeters.

The fourth supporting traces 234 are configured for connecting the first supporting traces 231 and the second supporting traces 232. With respect to each sprocket hole 220, there are two fourth supporting traces 234 provided between each first supporting trace 231 and each second supporting trace 232. Each fourth supporting trace 234 can be defined by two parallel waved copper lines or two parallel zigzag copper lines. A minimal width (a minimal distance between two parallel waved copper lines or two parallel zigzag copper lines) of the fourth supporting trace 234 is in a range from about 0.2 millimeters to 0.45 millimeters.

The above flexible bases 100, 200 can be manufactured by a photolithographic process or a laser ablation process. Firstly, a tape-shaped copper-clad laminate is provided. The copper-clad laminate includes an insulating substrate and a copper film formed on the insulating substrate. Secondly, sprocket holes can be formed in the copper-clad laminate using a mechanical drilling process, a chemical etching process or a laser drilling process. Thirdly, the metal film can be partially eliminated using a photolithographic process or a laser ablation process, thereby obtain the desired patterned supporting layer.

For example, in a laser ablation process for making the patterned supporting layer 130 of the first embodiment, parameters relative to the structure of the patterned supporting layer 130 can be predetermined in a laser ablation device. When the laser ablation device processes the metal film, the undesired portions (i.e., periphery portions of the first, second, third and fourth supporting traces 131, 132, 133 and 134) are removed. Thus, the residual portions of the metal film form the desired patterned supporting layer 130.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A flexible base for manufacturing flexible printed circuit boards, the flexible base comprising:
   a conveying region, the conveying region comprising:
      an insulating substrate;
      a plurality of sprocket holes defined along a lengthwise direction of the insulating substrate; and
      a patterned supporting layer formed on the insulating substrate, the patterned supporting layer comprising:
         a plurality of first supporting traces, each first supporting trace having an inner profile and an outer profile, the inner profile and an edge of a corresponding sprocket hole being collinear;
         at least two second supporting traces respectively configured on two sides of the sprocket holes along the lengthwise direction of the insulating substrate;
         a plurality of third supporting traces interconnecting adjacent first supporting traces; and
         a plurality of fourth supporting traces connecting interconnecting the first supporting traces and the second supporting traces.

2. The flexible base as claimed in claim 1, wherein the patterned supporting layer is comprised of metal material.

3. The flexible base as claimed in claim 2, wherein the metal material is one item selected from the group consisting of copper, gold, and alloys thereof.

4. The flexible base as claimed in claim 1, wherein each first supporting trace is a ring configuration.

5. The flexible base as claimed in claim 4, wherein the inner profile of the first supporting trace and the outer profile share a common center.

6. The flexible base as claimed in claim 5, wherein a shape of the inner profile is similar to a shape of the outer profile.

7. The flexible base as claimed in claim 5, wherein a shape of the inner profile is different from a shape of the outer profile.

8. The flexible base as claimed in claim 1, wherein each first supporting trace is a rectangular ring, and each sprocket hole is rectangular.

9. The flexible base as claimed in claim 8, wherein the inner profile of the first supporting trace and the outer profile share a common center.

10. The flexible base as claimed in claim 1, wherein a minimal distance between the inner profile and the outer profile is in a range from about 0.2 millimeters to about 0.6 millimeters.

11. The flexible base as claimed in claim 1, wherein each second supporting trace is a patterned wire with uniform width, and the uniform width is in a range from about 0.15 millimeters to about 0.3 millimeters.

12. The flexible base as claimed in claim 1, wherein each second supporting trace is a patterned wire with non-uniform width, and a minimal width of each second supporting trace is in a range from about 0.15 millimeters to about 0.3 millimeters.

13. The flexible base as claimed in claim 1, wherein each third supporting trace is a patterned wire with a uniform width, and the uniform width is in a range from about 0.2 millimeters to about 0.45 millimeters.

14. The flexible base as claimed in claim 1, wherein each third supporting trace is a patterned wire with non-uniform width, and a minimal width of each third supporting trace is in a range from about 0.2 millimeters to about 0.45 millimeters.

15. The flexible base as claimed in claim 1, wherein each fourth supporting trace is a patterned wire with uniform width, and the uniform width is in a range from about 0.2 millimeters to about 0.45 millimeters.

16. The flexible base as claimed in claim 1, wherein each fourth supporting trace is a patterned wire with non-uniform width, and a minimal width of each fourth supporting trace is in a range from about 0.2 millimeters to about 0.45 millimeters.

17. A flexible base for manufacturing flexible printed circuit boards, the flexible base comprising:
   a main region configured for forming flexible printed circuit board units; and
   two conveying regions separately arranged on two sides of the main region, each of the conveying regions comprising:
      an insulating substrate;
      a plurality of sprocket holes defined along a lengthwise direction of the insulating substrate; and
      a patterned supporting layer formed on the insulating substrate, the patterned supporting layer comprising:
         a plurality of first supporting traces each surrounding a corresponding sprocket hole;
         two second supporting traces positioned on two opposite sides of the sprocket holes, the second supporting traces running along the lengthwise direction of the insulating substrate;
         a plurality of third supporting traces each interconnecting two corresponding adjacent first supporting traces; and
         a plurality of fourth supporting traces each interconnecting a corresponding one of the two opposite sides of a corresponding first supporting trace and the corresponding second supporting trace.

18. A flexible base for manufacturing flexible printed circuit boards (FPCBs), the flexible base comprising:
   a plurality of FPCB unit regions defined in a central portion of the flexible base;
   two conveying regions respectively defined on two peripheral portions of the flexible base, each of the conveying regions comprising:
      an insulating substrate;
      a plurality of sprocket holes defined along a lengthwise direction of the insulating substrate; and
      a patterned supporting layer formed on the insulating substrate, the patterned supporting layer comprising:
         a plurality of first supporting traces each surrounding a corresponding sprocket hole;
         two second supporting traces positioned on two lateral sides of the sprocket holes and running along the lengthwise direction of the insulating substrate; and
         a plurality of third supporting traces each interconnecting two respective adjacent first supporting traces;
         wherein a first blank area is defined between one second supporting trace and the nearest third supporting traces, the first blank area running along the lengthwise direction of the insulating substrate, and a second blank area is defined between the other second supporting trace and the nearest third supporting traces, the second blank area running along the lengthwise direction of the insulating substrate, and the insulating substrate is exposed to the exterior in the first and the second blank areas.

19. The flexible base as claimed in claim 18, wherein the patterned supporting layer further comprises a plurality of fourth supporting traces each interconnecting one of the second supporting traces and a corresponding first supporting trace, the first blank area is separated into a plurality of first blank portions by corresponding fourth supporting traces, and the second blank area is separated into a plurality of second blank portions by corresponding fourth supporting traces.

20. The flexible base as claimed in claim 19, wherein each two adjacent first supporting traces are connected by two parallel third supporting traces, a third blank area is defined between the two parallel third supporting traces and the two adjacent first supporting traces, and the insulating substrate is exposed to the exterior in the third blank areas.

* * * * *